United States Patent [19]

Doan

[11] Patent Number: 5,132,236

[45] Date of Patent: Jul. 21, 1992

[54] METHOD OF SEMICONDUCTOR MANUFACTURE USING AN INVERSE SELF-ALIGNED MASK

[75] Inventor: Trung T. Doan, Boise, Id.

[73] Assignee: Micron Technology, Inc., Boise, Id.

[21] Appl. No.: 738,175

[22] Filed: Jul. 30, 1991

[51] Int. Cl.⁵ .................. H01L 21/265; H01L 21/465
[52] U.S. Cl. ........................ 437/34; 437/228; 437/984; 437/978; 148/DIG. 102
[58] Field of Search .......... 437/34, 228, 203, 187, 437/984; 148/102, 106

[56] References Cited

U.S. PATENT DOCUMENTS

| | | | |
|---|---|---|---|
| 4,462,151 | 7/1984 | Geipel, Jr. et al. | 29/576 B |
| 4,470,191 | 9/1984 | Cottrell et al. | 29/576 B |
| 4,471,523 | 9/1984 | Hu | 29/571 |
| 4,480,375 | 11/1984 | Cottrell et al. | 29/576 B |
| 4,509,991 | 4/1985 | Taur | 148/1.5 |
| 4,558,508 | 12/1985 | Kinney et al. | 29/871 |
| 4,795,716 | 1/1989 | Yilmax et al. | 437/27 |
| 4,843,023 | 6/1989 | Chiu et al. | 437/34 |
| 4,868,135 | 9/1989 | Ogura et al. | 437/31 |

Primary Examiner—Olik Chaudhuri
Assistant Examiner—Long Pham
Attorney, Agent, or Firm—Hopkins, French, Crockett, Springer & Hoopes

[57] ABSTRACT

A process for fabricating a CMOS integrated circuit having both P-channel and N-channel areas in the substrate. The process forms a single self-aligned mask to define the positions of both of the channel areas on the substrate. The process includes: depositing a maskable material on the substrate; photopatterning and etching the maskable material to expose a pattern of areas on the substrate; tailoring the pattern of areas as P-channel or N-channel; depositing a second material over the maskable material and over the tailored areas of the substrate; chemically mechanically polishing (CMP) the second material to an endpoint of the maskable material; selectively etching the maskable material to expose a second pattern of areas on the substrate aligned with the first pattern of areas; and then tailoring the second pattern of areas as P-channel or N-channel.

14 Claims, 2 Drawing Sheets

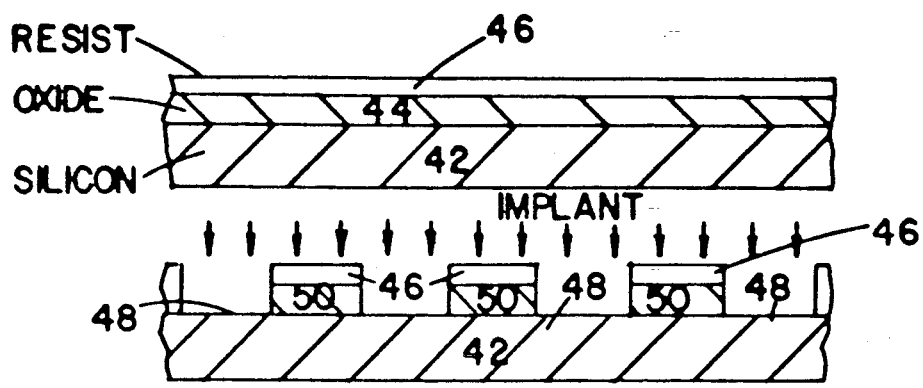
FIG 3A
FIG 3B
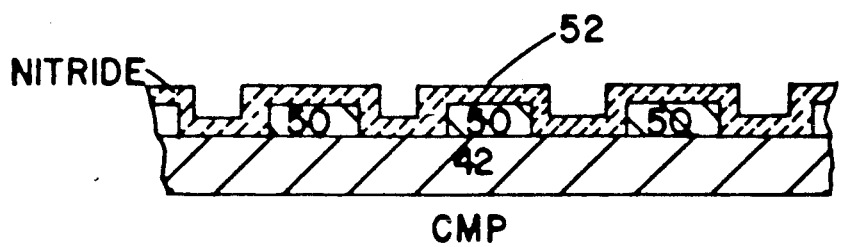
FIG 3C
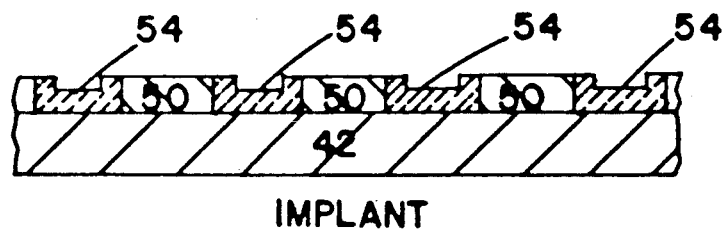
FIG 3D
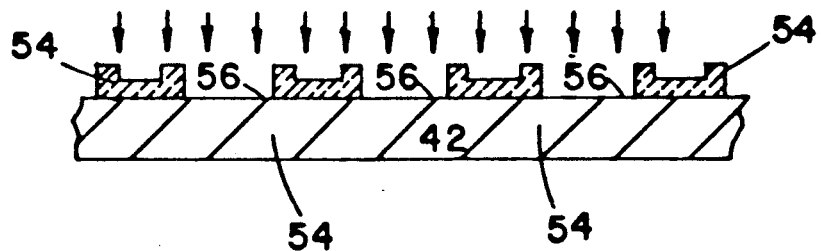
FIG 3E

METHOD OF SEMICONDUCTOR MANUFACTURE USING AN INVERSE SELF-ALIGNED MASK

FIELD OF THE INVENTION

This invention relates to semiconductor manufacture and more particularly to a novel method for forming an inverse self-aligned mask especially adapted for manufacturing CMOS devices, such as field effect transistors having dual wells.

BACKGROUND OF THE INVENTION

A complementary MOS (CMOS) is an MOS (metal oxide semiconductor) circuit formed with both N-channel and P-channel transistors. This type of semiconductor circuit is used to produce high performance devices without high power consumption. CMOS technology also allows circuits to be formed on one chip that would otherwise require several chips using N-channel and P-channel only circuits. A Bi-MOS circuit combines bipolar, P-channel, and N-channel transistors along with memory cells.

A representative CMOS device is disclosed in FIG. 1. The CMOS device 10 is formed on a wafer substrate 12 and includes an N-channel transistor 14 and a P-channel transistor 16. Each transistor 14,16 includes a source/drain 18, a gate 20, and a gate oxide 22. A P-well 26 is formed in the substrate 10 for the N-channel transistor 14, and an N-well 28 for the P-channel transistor 16.

CMOS devices 10 are formed by first fabricating the N-channel MOS transistor 14 in the deep P-well 26 formed in the wafer substrate 12. After N-channel transistor 14 formation, the P-channel transistor 16 is fabricated. To do so, two different photo masking steps are required to cover the N-channel area of the substrate 12 while tailoring the P-channel structure, and to cover the P-channel structure while tailoring the N-channel structure. This requires extra masks in addition to the already large number of masks required (i.e., PTUB mask, thin oxide mask, polysilicon mask, P-plus mask (positive), P-plus mask (negative), contact mask, metal mask). Moreover, each masking step requires the use of chip areas which otherwise could be occupied by the devices ultimately formed in the chip. Finally, lithographic masking steps require extreme precision and registration during formation thereof. Each additional lithographic masking step in a process introduces possible masking defects and increases mask-to-mask registration problems that decrease the processing yield and, accordingly, significantly increases the fabrication cost. A basic objective in IC fabrication is to minimize the number of basic lithographic masking steps required to produce a particular integrated circuit array of device structures.

Prior art manufacturing techniques have resulted in overly complicated manufacturing processes requiring numerous time-consuming and costly processing steps. Therefore, there is an ever increasing need for a semiconductor manufacturing process in which CMOS and Bi-MOS devices can be fabricated with a simplified process.

U.S. Pat. No. 4,558,508 to Kinney et al., discloses a semiconductor manufacturing process in which only a single lithographic masking step is required for providing self alignment both of the wells to each other and also of the field isolation doping regions to the wells. In the Kinney et al. disclosure, the lithographic masking step forms a well mask and defines an oxidation barrier which acts as an implant mask (absorber) during the ion-implantation of a field dopant of one type; an oxidation barrier over one well during the oxidation of the opposite type well to form over the one well a sacrificial oxide layer which forms the alignment marks for subsequent formation of the field doping regions; and a dopant transmitter during the ion implantation of an opposite type field dopant which is simultaneously absorbed by the sacrificial oxide.

Other processes for forming a self-aligned mask which eliminate separate masks for forming N-channel and P-channel devices in a semiconductor wafer are disclosed in U.S. Pat. No. 4,471,523 to Hu; U.S. Pat. No. 4,868,135 to Ogura et al; U.S. Pat. No. 4,480,375 to Cottrell et al.; U.S. Pat. No. 4,470,191 to Cottrell et al.; U.S. Pat. No. 4,462,151 to Geipel, Jr. et al.; U.S. Pat. No. 4,843,023 to Chin et al.; U.S. Pat. No. 4,509,991 to Taur; and U.S. Pat. No. 4,795,716 to Yilmax et al.

The present invention is directed to a process for the fabrication of CMOS devices wherein during manufacture an inverse self-aligned mask is formed using chemical mechanical polishing technology to isolate and align separate N-channel and P-channel areas of the substrates. The method of the invention simplifies the process for manufacturing such semiconductor devices by eliminating separate masking steps.

SUMMARY OF THE INVENTION

In accordance with the present invention, a novel method for forming an inverse self-aligned mask for the manufacture of CMOS semiconductor devices is provided. The method of the invention includes the steps of:

depositing a maskable material on a substrate;

forming a pattern of openings on the maskable material using a photolithographic process to define and expose a pattern of areas (or regions) on the substrate which may be tailored for a semiconductor device as required;

depositing a second material over the maskable material and over the pattern of areas on the substrate;

polishing the second material to an endpoint of the maskable material in order to define a second patterned layer on the substrate; and selectively removing the first material in order to expose a second pattern of areas on the substrate which may also be tailored for a semiconductor device as required.

As an example, the method of the invention may be used to implant N-wells and P-wells on a CMOS device, such as the prior art structure 10 shown in FIG. 1. This method simplifies processing because a separate mask is not required during formation of the separate N-channel and P-channel devices on the substrate. Additionally, the separate N-channel and P-channel devices are self-aligned with one another during formation of the mask of the invention. Finally, the method of the invention permits more devices to be located in a given chip area because less surface area on the chip needs to be dedicated to mask formation.

Other objects, advantages, and capabilities of the present invention will become more apparent as the description proceeds.

BRIEF DESCRIPTION OF THE DRAWINGS

FIGS. 3A-3D are diagrammatic representations of the steps involved in fabricating an inverse self-aligned mask during semiconductor manufacture in accordance with an illustrative embodiment of the method of the invention.

DETAILED DESCRIPTION OF THE PREFERRED EMBODIMENTS

In the manufacture of integrated circuits (ICs), various materials are utilized which are electrically either conductive, insulating, or semiconducting, although the completed semiconductor circuit device itself is usually referred to as a "semiconductor". One of the materials used is silicon, which is used as either single crystal silicon or as polycrystalline silicon material, referred to as "polysilicon".

Figure 2A:
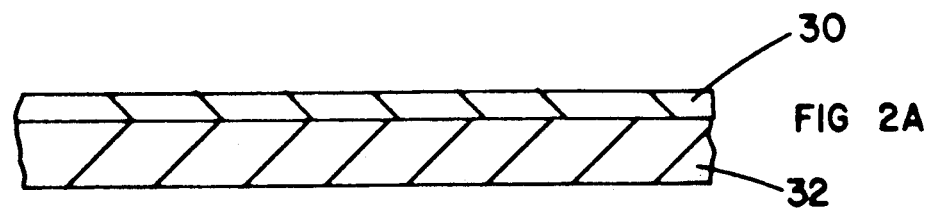
FIGS. 2A-2E are diagrammatic representations of the steps involved in fabricating an inverse self-aligned mask during semiconductor manufacture in accordance with the method of the invention.

As shown in FIG. 2A, in the initial step, a maskable material 30 is deposited upon a substrate 32. Substrate 32 may conventionally be formed of a single crystal silicon material. As an example, the maskable material 30 may be an oxide, such as silicon dioxide ($SiO_2$), that may be deposited to a desired thickness by a suitable technique, such as with low pressure chemical vapor deposition (CVD). Alternately, the silicon dioxide ($SiO_2$) may be grown on the surface of the substrate by techniques which are known in the art.

Figure 2B:
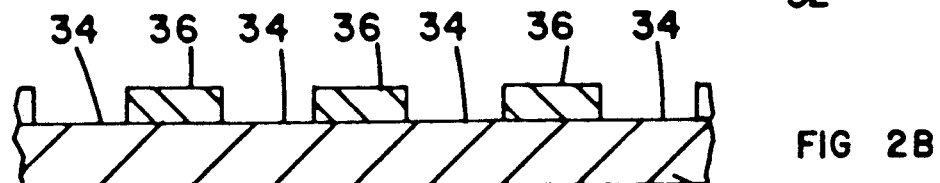

As shown in FIG. 2B, openings are then patterned through the maskable material 30 to the substrate by any suitable technique, such as photopatterning and etching. This forms a first patterned layer 36 of maskable material on the substrate 32 and exposes a pattern of areas 34 or regions on the substrate 32. These areas 34 of the substrate may then be tailored to form the desired semiconductor structure (e.g. P-well region or N-well region). As an example, the areas 34 on the substrate 32 may be implanted using a standard ion implantation technique. As an example, arsenic or phosphorous may be implanted for an N-channel device and boron for a P-channel device. During the ion implantation, the first patterned layer 36 of maskable material block the ions from penetrating the areas beneath the patterned layer 36 on the substrate.

Figure 2C:
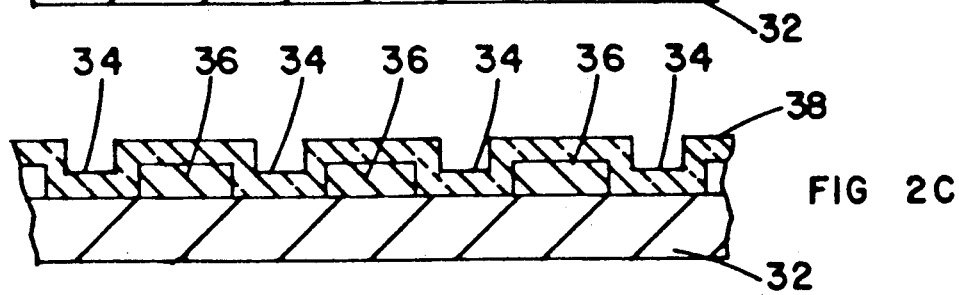

Next, and as shown in FIG. 2C, a second material 38 is conformally deposited over the first patterned layer 36 of maskable material and over the tailored pattern of exposed areas 34 on the substrate 32. This second material 38 may be any material that may be selectively removed with respect to the first patterned layer 36 of maskable material, previously deposited. As an example, silicon nitride ($SiN_4$) may be chemical vapor deposited (CVD) conformally onto the first patterned layer 36 and into the openings 34 on the substrate 32.

Another suitable second material 38 is $Si_3N_4$. Other materials may also be suitable for this application as will be apparent to one skilled in the art, as long as the second material 38 can later be selectively removed with respect to the maskable material forming the first patterned layer 36. As another example, a polymer may be deposited by plasma enhanced chemical vapor deposition (PECVD). Other means of deposition as will be apparent to one skilled in the art may also be utilized.

Figure 2D:
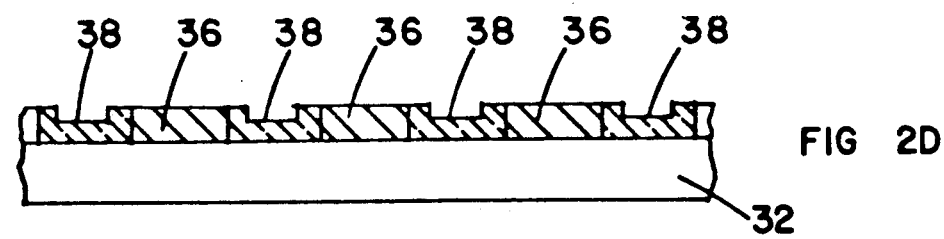

Next, and as shown in FIG. 2D, the second material 38 may be polished to at least the end point of the surface of the first patterned layer 36 of maskable material. A preferred method of polishing the second material 38 is by chemical mechanical planarization (CMP). In general, the chemical mechanical planarization process involves holding or rotating a thin flat wafer of semiconductor material against a wetted polishing surface under controlled pressure, temperature, and chemical conditions. A polishing slurry, such as a solution of alumina or silica, is utilized as the abrasive medium. A rotating polishing head is typically utilized to hold the wafer under controlled pressure against a rotating polishing platen. The polishing platen may be covered with a relatively soft, wetted material, such as blown polyurethane.

Such apparatus for polishing thin, flat, semiconductor wafers are well known in the art. U.S. Pat. Nos. 4,193,226 and 4,811,522 to Gill, Jr. and U.S. Pat. No. 3,841,031 to Walsh, for instance, disclose such apparatus.

Such (CMP) apparatus mechanically planarize the surface of the wafer in order to provide a planarized topography. Additionally, the planarization process smooths, flattens, and cleans the surface of the wafer. The parameters of the (CMP) process may be closely controlled to achieve a desired planarized endpoint. As shown in FIG. 2D, this planarized endpoint may be controlled such that the second material 38 is planarized to a planar endpoint of the first patterned layer 36 of maskable material. The planarization process may, however, continue to remove all of the second material 38 and some of the first patterned layer 36 of maskable material.

Figure 1:
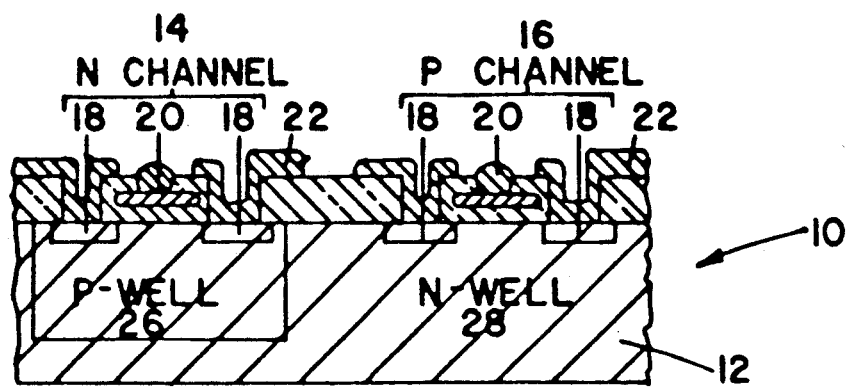
FIG. 1 is a schematic diagram of a CMOS semiconductor device known in the art.
Figure 2E:
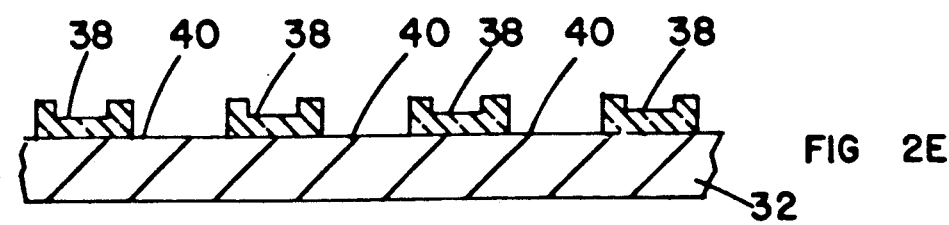

Next, as shown in FIG. 2E, the first patterned layer 36 of maskable material is removed to expose a second pattern of areas 40 or regions on the substrate 32. These exposed areas 40 may then be tailored as required, for forming a completed semiconductor device, such as the CMOS 10 shown in FIG. 1. During tailoring of the second pattern of areas 40 on the substrate 32, the second material 38 blocks or isolates the first pattern of areas 34 on the substrate 32 previously tailored.

Selective removal of the first patterned layer 36 of maskable material may be accomplished by a wet chemical etching technique or an isotropic dry etching technique. The chemical etchant may be selected to remove the first patterned layer 36 of maskable material but not affect the second material 38 or the substrate 32 of the wafer.

The second pattern of areas 40 or regions of the substrate 32 are precisely aligned by the process of the invention with the first pattern of areas 34 of the substrate 32 previously tailored. The process of the invention thus allows different areas of the substrate 32 to be separately tailored without the need for separate masks to cover and align these areas during tailoring.

As previously stated, the second material 38 serves as a block during tailoring of second pattern of areas 40 of the substrate 32. After tailoring of areas 40, this second material 38 may be removed or used as required in the completed semiconductor device. Again, removal of the second material 38 may be with techniques known in the art, such as wet chemical etching or isotropic dry etching.

Referring now to FIGS. 3A-3E, an illustrative embodiment of the process of the invention is shown:

1. A silicon substrate 42 has a layer of oxide 44, such as silicon dioxide ($SiO_2$), formed thereon (FIG. 3A).

2. A layer of resist 46 is then deposited onto the oxide layer 44 (FIG. 3A).

3. The resist 46 is then patterned and etched to form a patterned oxide layer 50 and expose a first pattern of areas 48 or regions on the substrate (FIG. 3B).

4. The first pattern of areas 48 is then tailored, such as with an ion implant (FIG. 3B).

5. The resist 46 is then removed (FIG. 3C).

6. A nitride layer 52, such as ($SiN_4$), is then deposited over the patterned oxide layer 50 and over the first pattern of areas 48 of the substrate 42.

7. Chemical mechanical planarization (CMP) is then used to planarize the nitride layer 52 at least to a planar endpoint of the patterned oxide layer 50 to form a patterned nitride layer 54 (FIG. 3D). The CMP process may also remove some of the patterned oxide layer 50 itself. All of the nitride layer 52, however, must be removed.

8. The patterned oxide layer or regions are then removed (i.e. using etching techniques) to expose a second pattern of areas 56 or regions on the substrate 54 (FIG. 3E).

9. The second pattern of areas 56 is then tailored by ion implant (FIG. 3E).

10. The patterned nitride layer 54 may be removed or used as required.

Thus, the method of invention provides a simple yet unobvious semiconductor manufacturing process in which an inverse self-aligned mask is formed. The mask is termed as inverse herein as areas on the substrate to be tailored are initially covered with a blocking material (i.e. patterned oxide layer, patterned nitride layer) which is then subsequently removed. The method of invention eliminates the need for formation and alignment of separate masks in the formation of devices having separate N-regions and P-regions on the substrate.

While the invention has been particularly shown and described with reference to the preferred embodiments thereof, it will be understood by those skilled in the art that various changes in form and details may be made therein without departing from the spirit and scope of this invention.

What is claimed is:

1. A method of forming an inverse self-aligned mask for the manufacture of semiconductor devices, comprising:
   forming a maskable material on the substrate;
   forming a pattern of openings on the maskable material to expose and define a first pattern of areas on the substrate;
   implanting a dopant to the first pattern of areas on the substrate;
   depositing a second material over the maskable material and over the pattern of areas on the substrate;
   polishing the second material to at least a planar endpoint of the maskable material;
   removing the maskable material to define a patterned second material and a second pattern of areas on the substrate; and then
   implanting the dopant to the second pattern of areas on the substrate.

2. The process as defined in claim 1 and further comprising:
   removing the patterned second material.

3. The process as defined in claim 2 and wherein:
   polishing of the second material to form the second patterned material is by chemical mechanical planarization (CMP).

4. The process as defined in claim 3 and wherein:
   forming of the openings in the maskable material is with a photoetch process.

5. The method as recited in claim 4 and wherein:
   the maskable material is an oxide.

6. The method as recited in claim 5 and wherein:
   the second material is a nitride.

7. A process for forming a mask for fabricating an integrated circuit having both P-channel and N-channel areas in a semiconductor substrate to define the positions of both channel areas comprising:
   depositing a layer of a maskable material on the substrate;
   depositing a layer of resist on the layer of maskable material;
   forming a pattern of openings in the layer of resist by a photolithograph process and etching the maskable material to the substrate to form a patterned maskable material and to define and expose a first pattern of areas on the substrate;
   implanting the first pattern of areas;
   depositing a layer of a second material over the maskable material and over the implanted areas of the substrate;
   chemically mechanically polishing the layer of second material to at least an endpoint of the oxide to form a patterned second material;
   selectively removing the patterned maskable material to expose a second pattern of areas on the substrate aligned with the first pattern of areas on the substrate; and then
   implanting the second pattern of areas.

8. The process as recited in claim 7 and further comprising:
   removing the second patterned material after implanting the second pattern of areas.

9. The process as recited in claim 8 and wherein:
   the maskable material is a silicon oxide.

10. The process as recited in claim 9 and wherein:
    the second material is a silicon nitride.

11. The process as recited in claim 10 and wherein:
    the second material is silicon nitride ($Si_3N_4$).

12. The process as recited in claim 10 and wherein:
    the second material is deposited by chemical vapor deposition (CVD).

13. The process as recited in claim 10 and wherein:
    the second material is a polymer deposited by a plasma enhanced chemical vapor deposition process (PECVD).

14. The process as recited in claim 8 and wherein:
    the patterned maskable material is removed with a selective wet etch.

* * * * *